(12) United States Patent
Yang

(10) Patent No.: US 8,159,009 B2
(45) Date of Patent: Apr. 17, 2012

(54) SEMICONDUCTOR DEVICE HAVING STRAIN MATERIAL

(75) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 12/621,736

(22) Filed: Nov. 19, 2009

(65) Prior Publication Data

US 2011/0115000 A1      May 19, 2011

(51) Int. Cl.
*H01L 29/78* (2006.01)

(52) U.S. Cl. ........ 257/288; 257/368; 257/390; 257/499; 257/510; 257/369; 257/E27.111; 257/E21.54

(58) Field of Classification Search .................. 257/288, 257/368, 369, 390, 499, 510, E27.111, E21.54
See application file for complete search history.

(56) References Cited

U.S. PATENT DOCUMENTS

| | | | |
|---|---|---|---|
| 6,967,866 B2 | 11/2005 | Hirata et al. | |
| 7,484,198 B2 | 1/2009 | Lin et al. | |
| 7,923,365 B2 * | 4/2011 | Kim et al. | 438/596 |

OTHER PUBLICATIONS

Rim, Kern. "Scaling of Strain-Induced Mobility Enhancements in Advanced CMOS Technology," Semiconductor R&D Center, IBM Systems and Technology Group, Hopewell Junction, NY, IEEE, 2008, 4 pages.

Chidambaram, P.R. et al. "Fundamentals of Silicon Material Properties for Successful Exploitation of Strain Engineering in Modern CMOS Manufacturing," IEEE Transactions on Electron Devices, vol. 53, No. 5, May 2006, p. 944-964.

* cited by examiner

*Primary Examiner* — Long Pham
(74) *Attorney, Agent, or Firm* — Sam Talpalatsky; Nicholas J. Pauley; Jonathan T. Velasco

(57) ABSTRACT

A semiconductor device having strain material is disclosed. In a particular embodiment, the semiconductor device includes a first cell including a first gate between a first drain and a first source. The semiconductor device also includes a second cell adjacent to the first cell. The second cell includes a second gate between a second drain and a second source. The semiconductor device further includes a shallow trench isolation area between the first source and the second source. A first amount of strain material over the first source and over the second source is greater than a second amount of strain material over the first drain and over the second drain.

38 Claims, 8 Drawing Sheets

SEMICONDUCTOR DEVICE HAVING STRAIN MATERIAL

I. FIELD

The present disclosure is generally related to semiconductor devices having strain material.

II. DESCRIPTION OF RELATED ART

Memory arrays, such as arrays of read only memory (ROM) cells, are fabricated to have high density and a smaller footprint than general logic devices. Due to the high density and small footprint of such devices and with the evolution of process technology, there is limited room on a semiconductor die for optical proximity correction (OPC) of device dimensions during fabrication of a system on chip (SOC) devices that include general logic gates and high density memory arrays. The limited room available for OPC correction of ROM devices that are embedded in SOC devices may lead to reduced device performance. The alternative of providing wider devices to permit OPC correction may improve performance but typically would consume greater memory area and would generate higher current leakage due to larger device sizes.

III. SUMMARY

A semiconductor device may have a strain material that causes a non-symmetric strain to a cell of the semiconductor device. For example, in a ROM device, more strain material may be applied in a region of a source of a transistor of a memory cell than in a region of a drain of the transistor. For example, the drain may be a common drain that is shared with a first adjacent cell and that provides little area for deposition of strain material over the common drain. In contrast, the source may be separated or isolated from a source of a second adjacent cell, providing a greater area for deposition of the strain material over the source. The additional strain material at the source as compared to the drain may induce a non-symmetric strain along a channel of the transistor of the memory cell that improves performance of the cell.

In a particular embodiment, a method is disclosed that includes applying a strain material to a semiconductor device comprising multiple cells. At least two of the cells are adjacent to each other. A first of the at least two cells includes a first source and a second of the at least two cells includes a second source. The first source is proximate to the second source, and a shallow trench isolation area is between the first source and the second source. At least a portion of the strain material is deposited over the shallow trench isolation area between the first source and the second source.

In another particular embodiment, the method includes applying a first mask to a semiconductor device to form a patterned device. The first mask identifies at least one dummy gate. The method includes etching the patterned device to remove the at least one dummy gate to form an etched region within the patterned device. The method further includes depositing a strain material to the etched region within the patterned device.

In another particular embodiment, an apparatus is disclosed that includes a semiconductor device. The semiconductor device includes a first cell including a first gate between a first drain and a first source. The semiconductor device also includes a second cell adjacent to the first cell. The second cell includes a second gate between a second drain and a second source. The semiconductor device further includes a shallow trench isolation area between the first source and the second source. A first amount of strain material over the first source and over the second source is greater than a second amount of strain material over the first drain and over the second drain.

One particular advantage provided by at least one of the disclosed embodiments is that a cell's performance may be enhanced by application of strain material that may result in a non-symmetrical induced strain to the cell. As a result, performance of a device, such as a ROM, may be improved without decreasing cell density. The increased performance due to the strain material may at least partially compensate for a reduction in performance due to decreased OPC correction as cell density increases.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
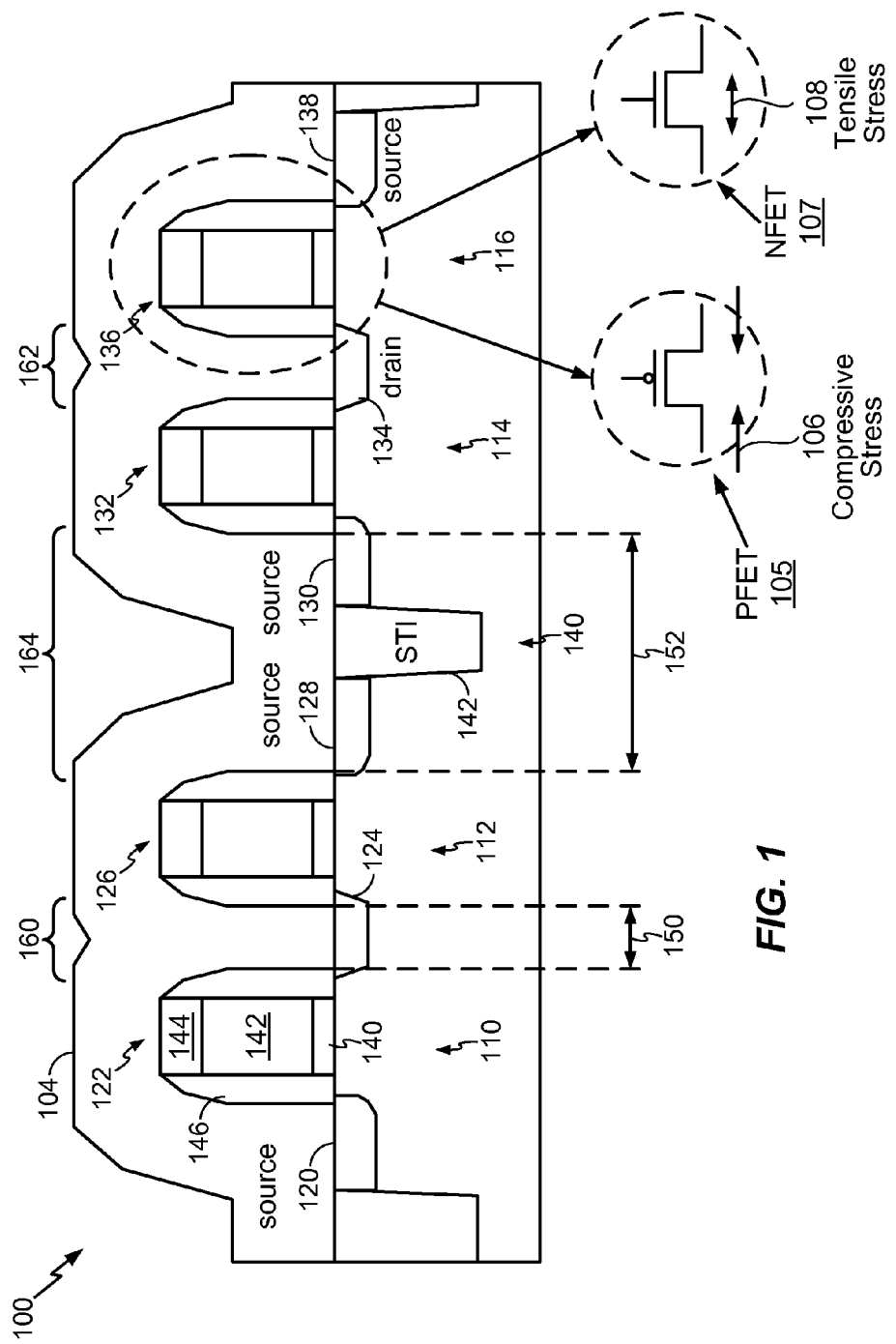
FIG. 1 is a diagram of a particular illustrative embodiment of a semiconductor device including strain material.

FIG. 1 depicts a semiconductor device 100 having a strain material 104 deposited over multiple representative cells 110, 112, 114, and 116. Cell 110 has a source 120, a gate 122, and a common drain 124 that is shared with cell 112. Cell 112 has a gate 126 and a source 128. The source 128 is proximate to a source 130 of cell 114. A shallow trench isolation area 140 is between the source 128 of cell 112 and the source 130 of cell 114. The shallow trench isolation area 140 includes an isolating material 142 within a semiconductor substrate and at least partially electrically isolates the source 128 from the source 130. Cell 114 has a gate 132 and a drain 134 that is shared with cell 116. The cell 116 includes a gate 136 and a source 138. In a particular embodiment, the semiconductor device 100 may be a non-volatile memory device. For example, the semiconductor device 100 may be a read-only memory (ROM).

In a particular embodiment, an amount of strain induced by the strain material 104 increases as the amount of strain material increases. The strain material 104 may include silicon nitride (SiN), silicon carbide (SiC), other strain material, or any combination thereof. As illustrated, a first amount 160 of the strain material 104 is over the common drain 124 of the cells 110 and 112 and is smaller than a second amount 164 of the strain material 104 over the source 128, the source 130, and the shallow trench isolation area 140. A third amount 162 of the strain material 104 is over the common drain 134 of the cells 114 and 116 and is substantially similar to the first amount 160. A greater amount of strain may therefore be provided at the sources 128, 130 than is provided at the common drains 124 and 134.

A first gate-to-gate distance 150 between adjacent cells 110 and 112 sharing the common drain 124 provides a physical limitation to the amount of strain material 104 that can be deposited over the common drain 124. In contrast, a second gate-to-gate distance 152 between adjacent cells 112 and 114 separated by the shallow trench isolation area 140 enables a greater amount 164 of the strain material 104 to be deposited over the sources 128 and 130. As illustrated, the strain material 104 over the source 128 and the source 130 extends substantially continuously over the shallow trench isolation area 140. As a result, a greater amount of strain may be induced by the strain material 104 at the source 128 and the source 130 than at the drain 124 and the drain 134.

Each of the cells 110-116 may enable control of an electrical path between the source and drain of the cell. For example, cell 110 controls a carrier path (e.g. a path of travel of electrons, holes, or a combination thereof) along a channel between the source 120 and the drain 124 in response to a signal applied to the gate 122. The gate 122 includes an insulator 140, a gate metal 142, a capping layer 144, and protective sidewall material 146. One or more of the representative cells, such as the representative cell 116, may be a P-type field effect transistor (PFET) 105, in which case the strain material 104 may apply a compressive stress 106 to a channel of the PFET 105. Alternatively, the representative cell 116 may be an N-type FET (NFET) 107. The strain material 106 may apply a tensile stress 108 to a channel of the NFET 107.

As a result of the greater amount 164 of strain material 104 over the shallow trench isolation area 140 than over the common drains 124, 134, an asymmetrical strain may be applied to the channels of adjacent cells. As compared to a cell layout that includes a dummy gate positioned over the shallow trench isolation area 140, the asymmetrical strain may improve carrier mobility within the channels of the adjacent cells and enhance cell performance without reducing a cell density of the semiconductor device 100. For example, increased cell density may reduce an amount of space between adjacent gates, such as between the gates 122 and 126. As gate pitch (i.e. the distance between adjacent gates) becomes proportionally smaller than the height of the gates, effective deposition of strain material between the gates becomes more difficult. For example, deposited material may pinch off between the gates and limit an effective amount of material that is deposited. However, the greater gate-to-gate distance 152 across the shallow trench isolation area 140 enables effective deposition of the strain material even with a reduced gate pitch (i.e. with a reduction of the gate-to-gate distance 150).

Figure 2:
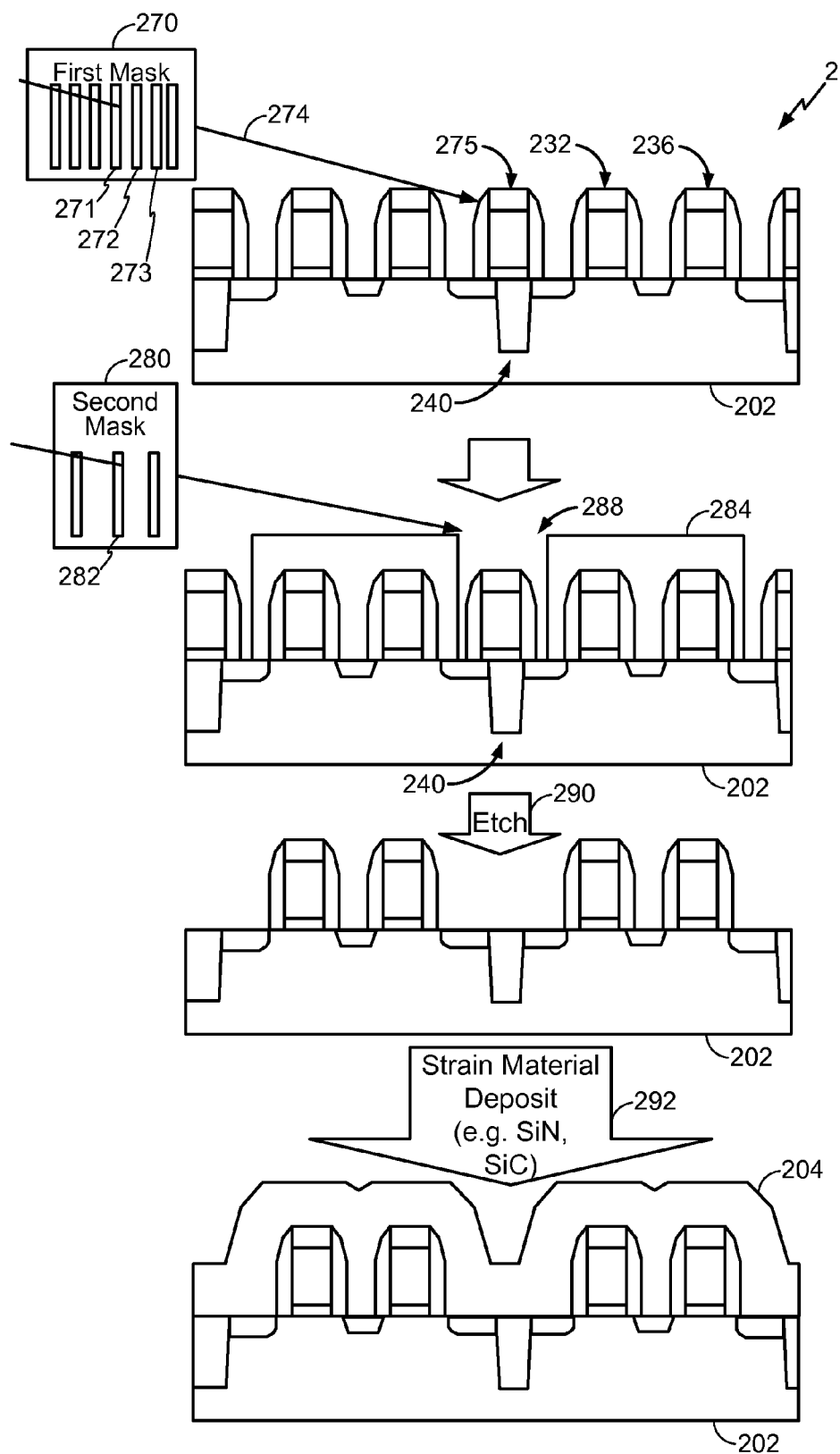
FIG. 2 is a general diagram of a first illustrative embodiment of fabrication of a semiconductor device including strain material.

FIG. 2 depicts a first illustrative embodiment of device fabrication 200. The fabrication 200 includes an application of a first mask 270 to a semiconductor device 202 to form a patterned device including dummy gate structures. In an illustrative embodiment, the fabrication 200 may be used to form the semiconductor device 100 of FIG. 1.

The first mask 270 includes multiple features such as representative features 271, 272, and 273. For example, the first mask 270 may be a photolithography mask, and each of the features 271, 272, and 273 may correspond to one or more lithography processing regions to define one or more gate features on the semiconductor device 202. As illustrated, the semiconductor device 202 includes a shallow trench isolation area 240 and also includes a first representative gate feature 232 and a second representative gate feature 236 on adjacent cells. A dummy gate feature 275 is formed over the shallow trench isolation area 240. The features 271-273 may be substantially uniform and evenly spaced to reduce an amount of processing variation and to result in a substantially uniform array of gates (including dummy gates) on the semiconductor device 202.

A representative photolithography process 274 illustrates that the feature 271 of the first mask corresponds to the dummy gate 275. Likewise, the mask feature 272 corresponds to the gate 232 and the mask feature 273 corresponds to the gate 236. Although a single photolithography process 274 is shown for ease of explanation, the gates 232, 236, and 275 may be formed using multiple processing stages that may include multiple photolithography applications.

A second mask 280 may be applied in a second process, such as a second lithography process. The second mask 280 includes a feature 282 that corresponds to a dummy gate etch region 288 of the semiconductor device 202. For example, material 284 may include a photoresist and may be applied to the semiconductor device 202. The second mask 280 may be used to selectively expose regions of the material 284, and the material 284 may be removed from the etch region 288.

After using the second mask 280 during processing to remove the material 284 at the etch region 288, an etch 290 may be performed. The etch 290 may include one or more etching stages or types (e.g. one or more wet etches, dry etches, or any combination thereof) that remove the dummy gate 275 without removing the gates 232 and 236. After the etch 290, remaining material 284 may be removed and a strain material deposit 292 may be performed to apply a strain material 204 to the semiconductor device 202. For example, the strain material 204 may include silicon nitride (SiN), silicon carbide (SiC), other strain material, or any combination thereof.

Figure 3:
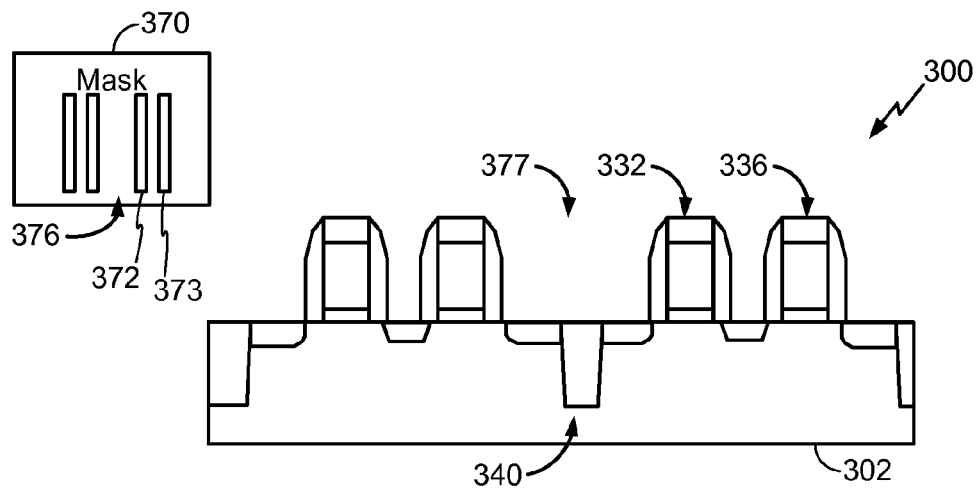
FIG. 3 is a general diagram of a second illustrative embodiment of fabrication of a semiconductor device including strain material.
Figure 3:
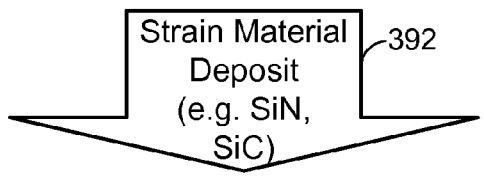
Figure 3:
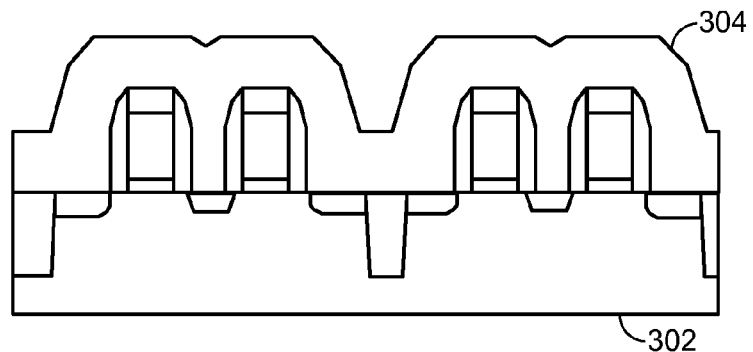

FIG. 3 depicts a second illustrative embodiment of device fabrication 300. The fabrication 300 includes a mask 370 having a first representative feature 372 corresponding to a gate 332 and a second representative feature 373 corresponding to a gate 336 of a semiconductor device 302. The mask 370 includes a mask area 376 corresponding to a region 377 of the semiconductor device 302. The mask area 376 is illustrated as a featureless area to indicate that no gate is formed at the region 377 of the semiconductor device 302. The region 377 includes a shallow trench isolation area 340 but does not include a gate formed over the shallow trench isolation area 340.

A strain material deposition 392 may be performed to apply strain material 304 on the semiconductor device 302. For example, the strain material deposition 392 may deposit SiN, SiC, one or more other materials capable of inducing strain, or any combination thereof. The resulting patterned device 302 may be substantially similar to the patterned device 202 of FIG. 2. However, the fabrication 300 simplifies processing as compared to FIG. 2 by not including a lithography stage to remove dummy gate structures.

Figure 4:
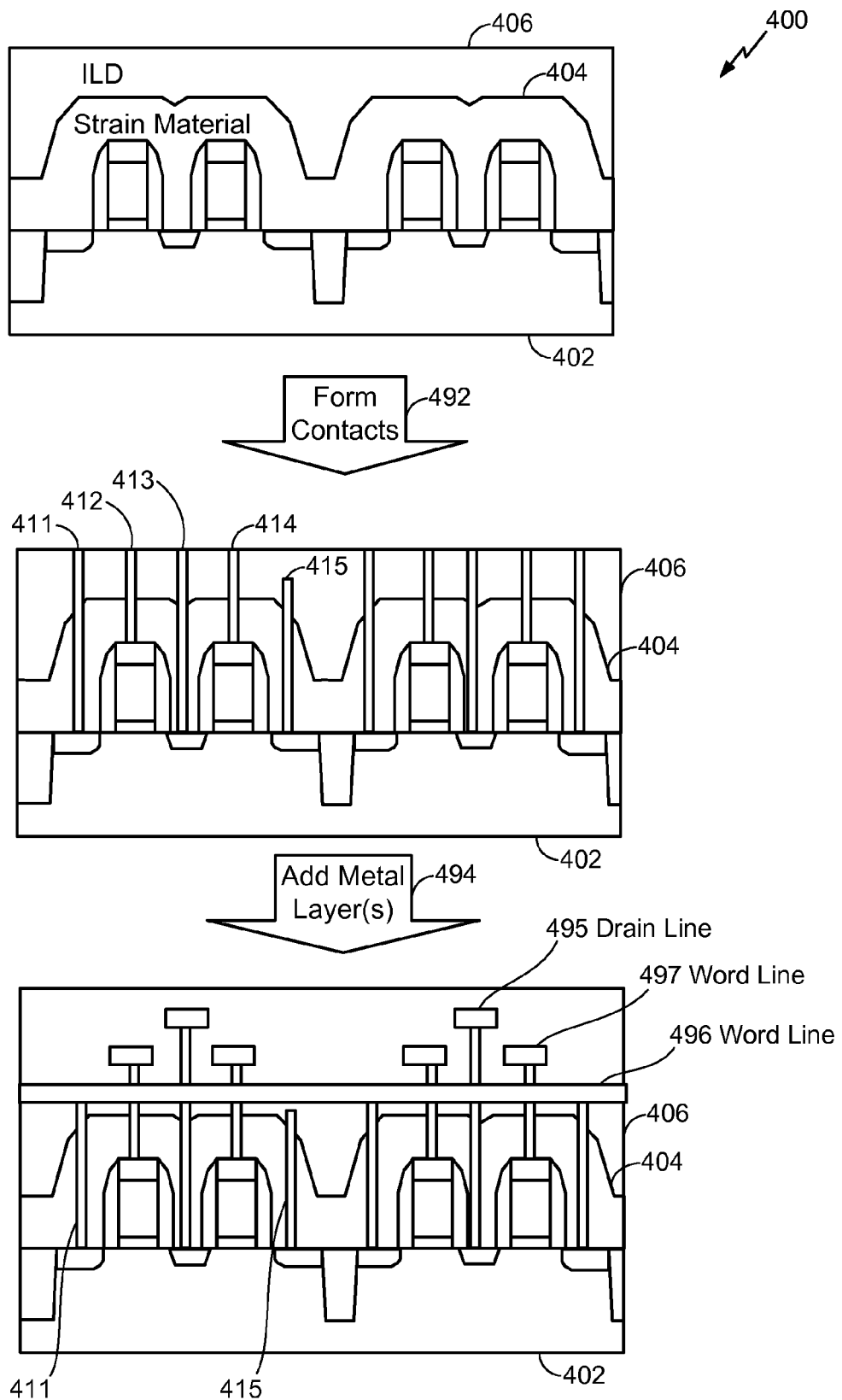
FIG. 4 is a general diagram of a third illustrative embodiment of fabrication of a semiconductor device including strain material.

FIG. 4 depicts a particular embodiment of fabrication 400 of a semiconductor device 402, such as processing applied to the semiconductor device 202 generated by the fabrication 200 of FIG. 2 or to the semiconductor device 302 generated by the fabrication 300 of FIG. 3. The semiconductor device 402 includes multiple cells that each share a common drain with a first adjacent cell and are separated from a second adjacent cell via a shallow trench isolation area. A strain material 404 is deposited over the cells in a substantially similar manner as described with respect to the strain material 104 of FIG. 1. An interlayer dielectric (ILD) material 406 is above the strain material 404.

A contact formation 492 results in a formation of electrically conductive contacts to the semiconductor device 402. To illustrate, a contact 411 provides an electrically conductive path to a source of a first cell, a contact 412 provides an electrically conductive path to a gate of the first cell, and a contact 413 provides an electrically conductive path to a common drain shared by the first cell and a second cell adjacent to the first cell. A contact 414 provides an electrically conductive path to a gate of the second cell, and a contact 415 provides an electrically conductive path to a source of the second cell.

In an illustrative embodiment, the contacts 411-415 may be formed by etching the ILD material 406 and the strain material 404 to form vias or trenches to the cells. A metal deposition may be performed to form electrically conductive paths within the vias or trenches.

As illustrated, the contacts 411-414 extend to a top surface of the ILD 406. However, the contact 415 does not extend to the top surface of the ILD 406. In an illustrative embodiment, the contact 415 represents a programming of the cell as a read only memory (ROM) cell to store a particular data value. For example, the data value stored by each cell may be indicated by whether a source region is in contact with a metal layer or is not in contact with a metal layer. The first cell having the contact 411 may store a first logical value, such as a logical "0" value, while the second cell having the source contact 415 may store a second logical value, such as a logical "1" value.

An addition of metal layers to the semiconductor device 402 is performed, at 494. The metal layers may include one or more word lines 497, one or more bit lines 496, and one or more drain lines 495. As illustrated, the contact 411 extends to the bit line 496, while the contact 415 does not extend to the bit line 496. As a result, when appropriate read data voltages are applied to the drain line 495 (e.g. a ground signal) and to the word line 497, a voltage at the bit line 496 may be measured and compared to a logical value to determine a data value stored at the selected cell. For example, the bit line 496 may be pre-charged to a logical "1" level and may discharge to a logical "0" level when a selected cell is coupled to the bit line 496 (e.g. the cell having the contact 411) but may not discharge to the logical "0" level when a selected cell is not coupled to the bit line (e.g. the cell having the contact 415).

Figure 5:
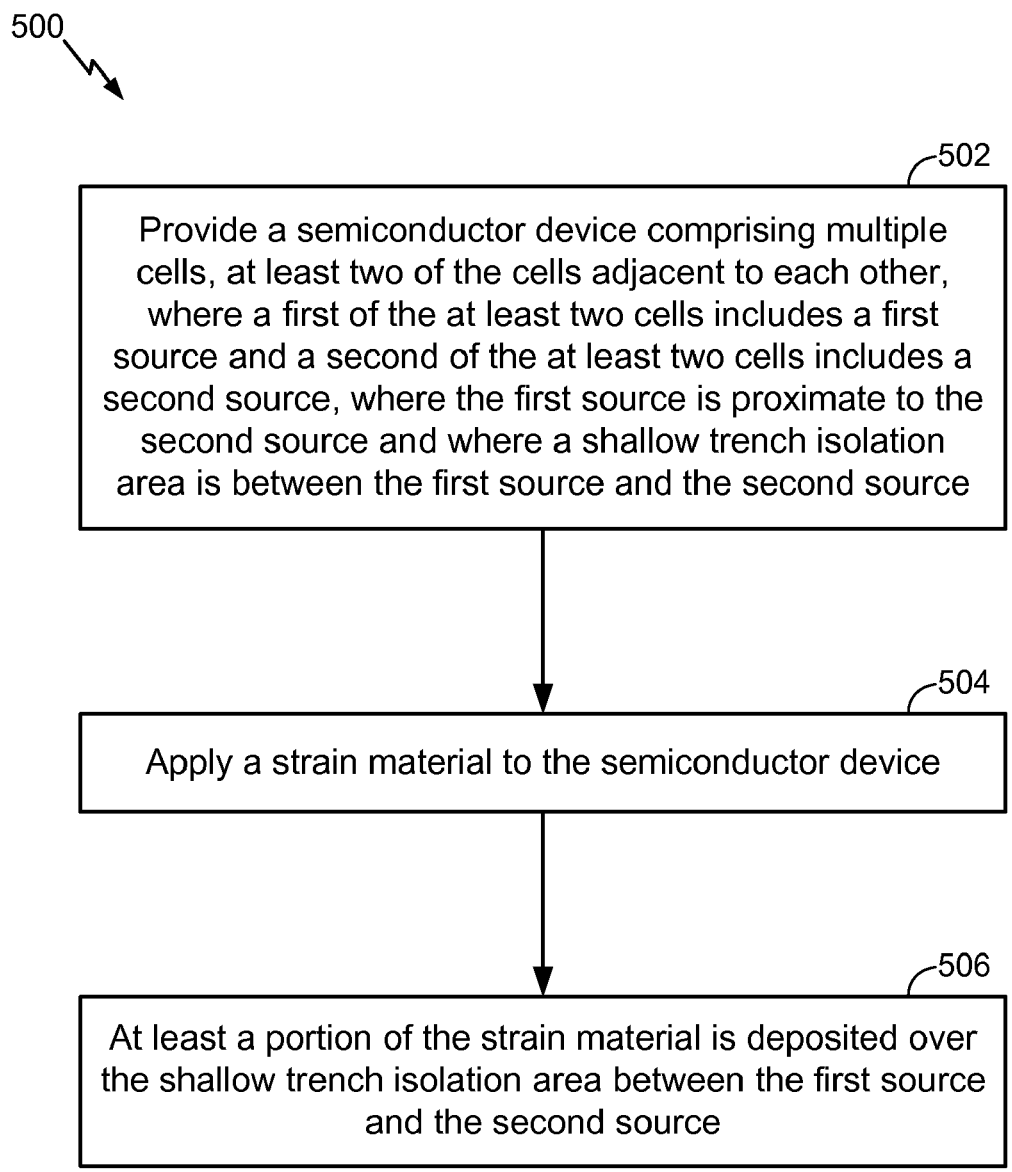
FIG. 5 is a flow diagram of a first illustrative embodiment of a method of forming a semiconductor device including strain material.

FIG. 5 is a flow diagram of a first illustrative embodiment of method of forming a semiconductor device including strain material. A semiconductor device comprising multiple cells may be provided, at 502. At least two of the cells are adjacent to each other, such as the cell 112 and the cell 114 of FIG. 1. A first of the at least two cells comprises a first source and a second of the at least two cells comprises a second source. The first source is proximate to the second source, and a shallow trench isolation area is between the first source and the second source. For example, the shallow trench isolation area 140 of FIG. 1 is located between the source 128 of the cell 112 and the source 130 of the adjacent cell 114.

A strain material is applied to the semiconductor device, at 504. For example, the strain material may be deposited as described with respect to the strain material deposit 292 of FIG. 2. At least a portion of the strain material is deposited over the shallow trench isolation area between the first source and the second source, at 506. More strain material may be deposited over the first source than over a drain corresponding to the first source. To illustrate, more strain material can be deposited over the source 128 than over the drain 124 of FIG. 1 due to the larger available area between gate structures between the cells 112 and 114 than between the cells 110 and 112.

A first gate-to-gate distance of a first set of adjacent cells having a common drain may be smaller than a second gate-to-gate distance of a second set of adjacent cells having separate drains. For example, the first gate-to-gate distance 150 between the first set of adjacent cells 110, 112 is smaller than the second gate-to-gate distance 152 between the second set of adjacent cells 112, 114 of FIG. 1. The second gate-to-gate distance exceeding the first gate-to-gate distance may enable application of more strain material between cells of the second set of adjacent cells than between cells of the first set of adjacent cells. In a particular embodiment, such as in the semiconductor device 100 of FIG. 1, the shallow trench isolation area is between the sources of the second set of adjacent cells and deposition of the strain material results in a greater amount of strain material over the shallow trench isolation area than over the common drain of the first set of adjacent cells.

The semiconductor device may be a memory device, such as a read only memory (ROM) as an illustrative, non-limiting example. Applying the strain material may be initiated at a processor integrated into an electronic device. For example, as will be described with respect to FIG. 8, applying the strain material may be initiated by a computer or other electronic device at a fabrication process 828. Alternatively, or in addition, one of skill in the art will recognize that the method 500 of FIG. 5 may be implemented or initiated by a field programmable gate array (FPGA), an application-specific integrated circuit (ASIC), a central processing unit (CPU), a digital signal processor (DSP), a controller, another hardware device, or any combination thereof.

Figure 6:
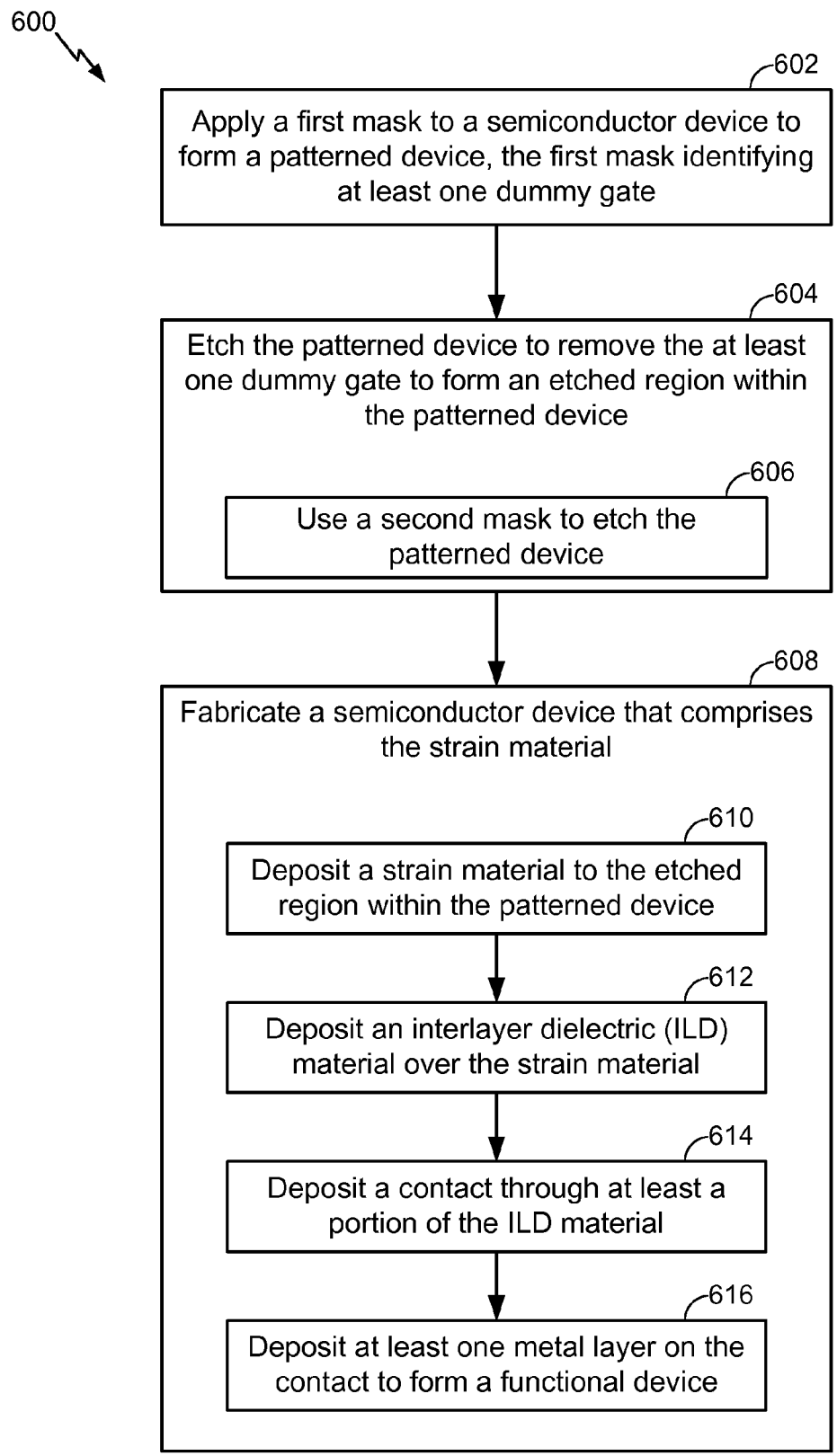
FIG. 6 is a flow diagram of a second illustrative embodiment of a method of forming a semiconductor device including strain material.

FIG. 6 is a flow diagram of a second illustrative embodiment of a method of forming a semiconductor device including strain material. In an illustrative embodiment, the semiconductor device may be the semiconductor device 100 of FIG. 1.

A first mask is applied to a semiconductor device to form a patterned device, at 602. The first mask identifies at least one dummy gate. For example, the first mask may be the first mask 270 of FIG. 2 that identifies the dummy gate 275 via the feature 271. In a particular embodiment, the at least one dummy gate is electrically isolated from functional circuitry within the semiconductor device. The at least one dummy gate may be non-operational.

The patterned device is etched to remove the at least one dummy gate to form an etched region within the patterned device, at 604. For example, a second mask, such as the second mask 280 of FIG. 2, may be used to etch the patterned device, at 606.

A semiconductor device may be fabricated that comprises the strain material, at 608. The strain material may include silicon carbide or silicon nitride, as illustrative, non-limiting examples. In a particular embodiment, the strain material has strong tensile stress and is deposited over a source of an n-type field effect transistor (NFET) device that is adjacent to the etched region. In another particular embodiment, the strain material has a compressive stress and is deposited over a source of a p-type field effect transistor (PFET) device that is adjacent to the etched region.

For example, fabricating the semiconductor device may include depositing a strain material to the etched region within the patterned device, at 610, such as via the strain material deposit 292 of FIG. 2. An interlayer dielectric (ILD) material, such as the ILD 406 of FIG. 4, may be deposited over the strain material, at 612.

A contact may be deposited through at least a portion of the ILD material, at 614. To illustrate, the contact may be deposited as described with respect to one or more of the contacts 411-415 of FIG. 4. At least one metal layer may be deposited on the contact to form a functional device, at 616. As an example, the addition of the metal layers 494 of FIG. 4 to form the one or more drain lines 495, bit lines 496, and word lines 497 may be performed to form a functional ROM device.

Applying the first mask, etching the patterned device, depositing the strain material, or any combination thereof, may be initiated at a processor integrated into an electronic device. For example, as will be described with respect to FIG. 8, applying the first mask, etching the patterned device, depositing the strain material, or any combination thereof, may be initiated by a computer or other electronic device at a fabrication process 828. Alternatively, or in addition, one of skill in the art will recognize that the method 600 of FIG. 6 may be implemented or initiated by a field programmable gate array (FPGA), an application-specific integrated circuit (ASIC), a central processing unit (CPU), a digital signal processor (DSP), a controller, another hardware device, or any combination thereof.

Although the semiconductor devices depicted in FIGS. 1-4 and the methods of FIGS. 5-6 are described in terms of a cell layout that has sources separated by isolation areas and that has common drains, in other embodiments one or more sets of adjacent cells may instead have drains that are separated by isolation areas and common sources that are shared by the adjacent cells. In such embodiments, more strain material may be deposited over drain regions than over source regions, and more strain may be induced at the drain regions than the source regions due to the greater amount of strain material over the drains. Applying greater induced stain to a channel of a device near a drain than near a source may also provide enhanced carrier mobility or device performance as compared to devices having dummy gate structures and less strain material that is applied substantially symmetrically between sources and drains due to the presence of the dummy gate structures.

Figure 7:
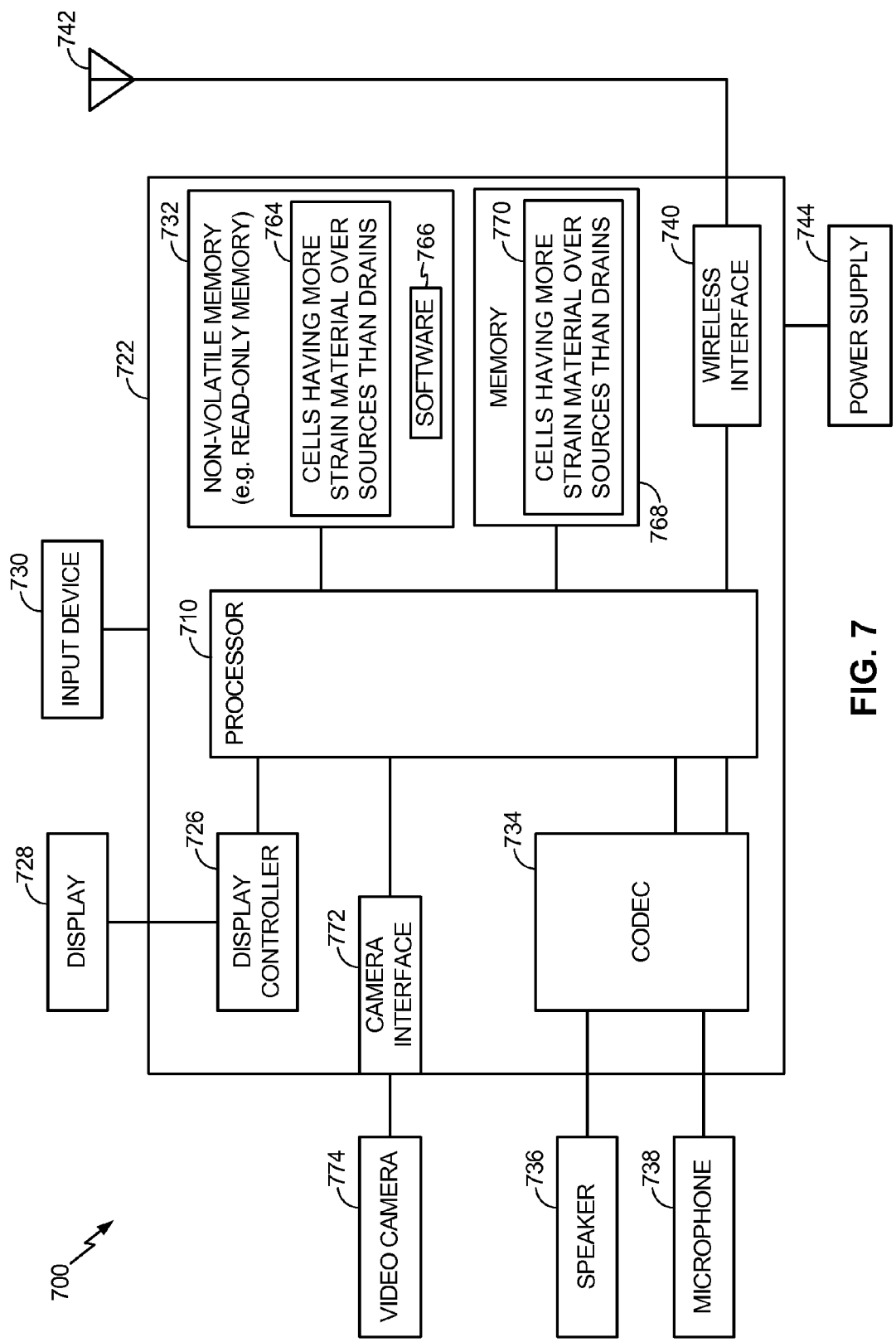
FIG. 7 is a block diagram of a particular embodiment of a wireless communication device including a component including cells having more strain material over sources than over drains.

FIG. 7 is a block diagram of a particular embodiment of a system 700 including a component including cells having more strain material over sources than drains 764, 770. The system 700 may be implemented in an electronic device and includes a processor 710, such as a digital signal processor (DSP), coupled to a computer readable medium, such as a non-volatile memory 732 (e.g. a read-only memory (ROM)), storing computer readable instructions, such as software 766. The system 700 includes components including cells having more strain material over sources than drains, such as the non-volatile memory 732 including the cells 764 and the memory 768 including the cells 770.

In an illustrative example, the cells 764, 770 having more strain material over sources than drains may be formed in accordance with any of the embodiments of FIGS. 1-6. In addition to the cells 764 in the non-volatile memory 732 and the cells 770 in the memory 768, other cells having more strain material over sources than drains may be in the processor 710 or may be in a separate device or circuitry (not shown).

A camera interface 772 is coupled to the processor 710 and is also coupled to a camera, such as a video camera 774. A display controller 726 is coupled to the processor 710 and to a display device 728. A coder/decoder (CODEC) 734 can also be coupled to the processor 710. A speaker 736 and a microphone 738 can be coupled to the CODEC 734. A wireless interface 740 can be coupled to the processor 710 and to a wireless antenna 742.

In a particular embodiment, the processor 710, the display controller 726, the non-volatile memory 732, the memory 768, the CODEC 734, the wireless interface 740, and the camera interface 772 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, the video camera 774, and the power supply 744 are external to the system-on-chip device 722. However, each of the display device 728, the input device 730, the speaker 736, the microphone 738, the wireless antenna 742, the video camera 774, and the power supply 744 can be coupled to a component of the system-on-chip device 722, such as an interface or a controller.

Figure 8:
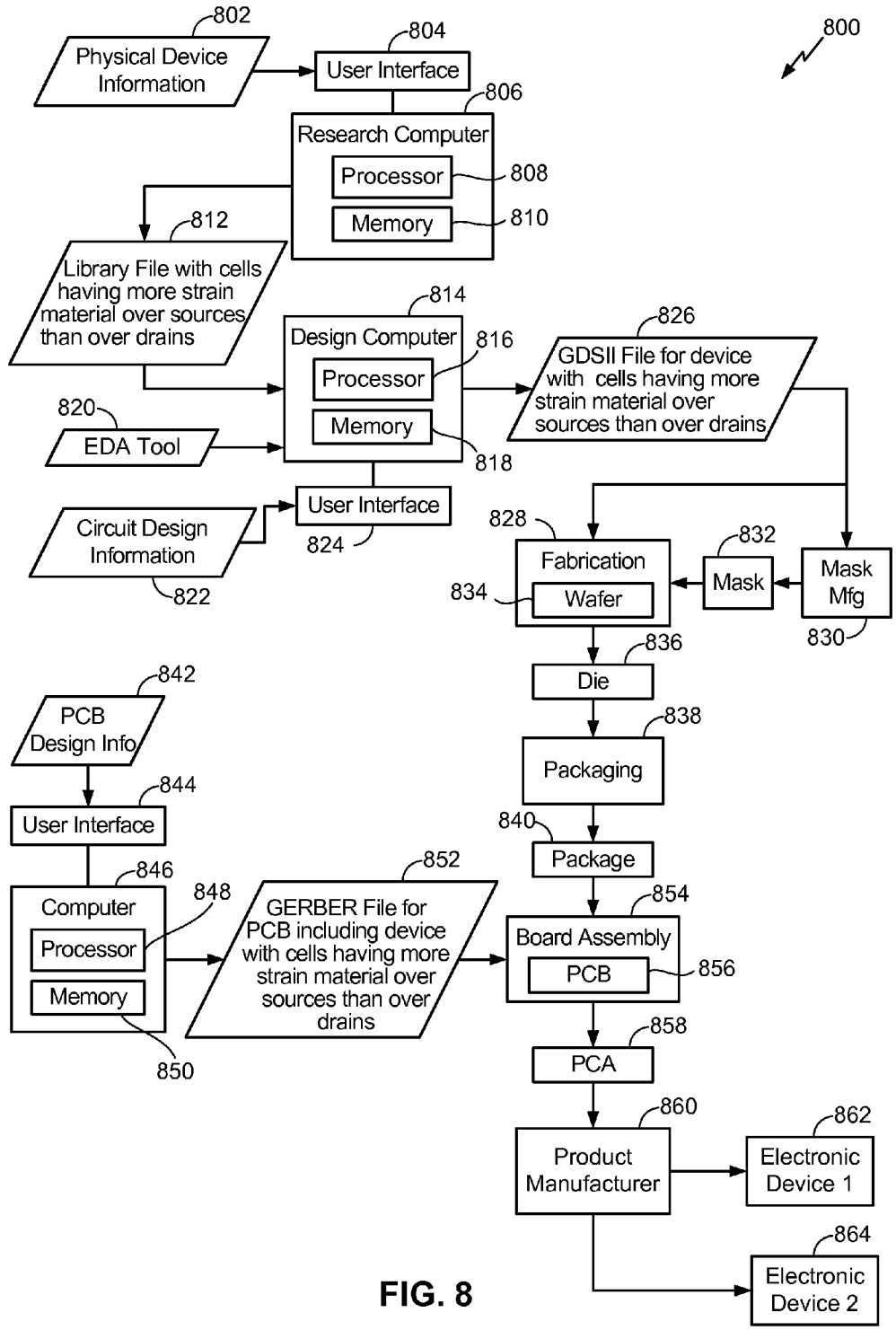
FIG. 8 is a data flow diagram illustrating a manufacturing process for use with cells having more material over sources than over drains.

The foregoing disclosed devices and functionalities (such as the device of FIG. 1, the fabrication processes and methods of FIGS. 2-6, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as a device with cells having more strain material over sources than over drains as illustrated in FIG. 1 or formed in accordance with any of FIGS. 2-6. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including transformed design information. For example, the library file 812 may include a library of semiconductor devices including a device with cells having more strain material over sources than over drains as illustrated in FIG. 1 or formed in accordance with any of FIGS. 2-6, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a device with cells having more strain material over sources than over drains as illustrated in FIG. 1 or formed in accordance with any of FIGS.

2-6, of the library file 812. For example, a user of the design computer 814 may enter circuit design information 822 via a user interface 824 coupled to the design computer 814. The circuit design information 822 may include design information representing at least one physical property of a semiconductor device, such as a device with cells having more strain material over sources than over drains as illustrated in FIG. 1 or formed in accordance with any of FIGS. 2-6. To illustrate, the circuit design information may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the device with cells having more strain material over sources than over drains as illustrated in FIG. 1 or formed in accordance with any of FIGS. 2-6, in addition to other circuits or information. To illustrate, the data file may include information corresponding to a system-on-chip (SOC) that includes a device with cells having more strain material over sources than over drains as illustrated in FIG. 1 or formed in accordance with any of FIGS. 2-6 and that also includes additional electronic circuits and components within the SOC.

The GDSII file 826 may be received at a fabrication process 828 to manufacture the device with cells having more strain material over sources than over drains as illustrated in FIG. 1 or formed in accordance with any of FIGS. 2-6, according to transformed information in the GDSII file 826. For example, a device manufacture process may include providing the GDSII file 826 to a mask manufacturer 830 to create one or more masks, such as masks to be used for photolithography processing, illustrated as a representative mask 832. For example, the mask 832 may be the first mask 270 of FIG. 2, the second mask 280 of FIG. 2, the mask 370 of FIG. 3, or any combination thereof, as illustrative, non-limiting examples. The mask 832 may be used during the fabrication process to generate one or more wafers 834, which may be tested and separated into dies, such as a representative die 836. The die 836 includes a device including cells having more strain material over sources than over drains as illustrated in FIG. 1 or formed in accordance with any of FIGS. 2-6.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the device with cells having more strain material over sources than over drains as illustrated in FIG. 1 or formed in accordance with any of FIGS. 2-6.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the device with cells having more strain material over sources than over drains as illustrated in FIG. 1 or formed in accordance with any of FIGS. 2-6. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device that includes active integrated circuitry including memory and on-chip circuitry.

Thus, devices with cells having more strain material over sources than over drains as illustrated in FIG. 1 or formed in accordance with any of FIGS. 2-6 may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof.

For example, the GDSII file 826 or the fabrication process 828 can include a computer readable tangible medium storing instructions executable by a computer, a controller of a material deposition system, or other electronic device, the instructions including instructions that are executable by a processor of the computer or controller to initiate formation of a device with cells having more strain material over sources than over drains as illustrated in FIG. 1 or formed in accordance with any of FIGS. 2-6. For example, the instructions may include instructions that are executable by a computer to initiate applying a strain material to a semiconductor device comprising multiple cells, at least two of the cells adjacent to each other, where a first of the at least two cells comprises a first source and a second of the at least two cells comprises a second source, where the first source is proximate to the second source and where a shallow trench isolation area is between the first source and the second source. At least a portion of the strain material may be deposited over the shallow trench isolation area between the first source and the second source.

Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    applying a strain material to a semiconductor device comprising multiple cells, at least two of the cells adjacent to each other,
    wherein a first of the at least two cells comprises a first source and a second of the at least two cells comprises a second source,
    wherein the first source is proximate to the second source and wherein a shallow trench isolation area is between the first source and the second source,
    wherein at least a portion of the strain material is deposited over the shallow trench isolation area between the first source and the second source, and
    wherein a first gate-to-gate distance of a first set of adjacent cells of the semiconductor device having a common drain is smaller than a second gate-to-gate distance of a second set of adjacent cells of the semiconductor device having separate sources.

2. The method of claim 1, wherein more strain material is deposited over the first source than over a drain corresponding to the first source.

3. The method of claim 1, wherein the semiconductor device is a memory device.

4. The method of claim 3, wherein the memory device is a read only memory.

5. The method of claim 1, wherein the second gate-to-gate distance exceeding the first gate-to-gate distance enables application of more strain material between cells of the second set of adjacent cells than between cells of the first set of adjacent cells.

6. The method of claim 1, wherein the shallow trench isolation area is between sources of the second set of adjacent cells and wherein deposition of the strain material results in a greater amount of the strain material over the shallow trench isolation area than over the common drain of the first set of adjacent cells.

7. The method of claim 1, wherein applying the strain material is initiated by a processor integrated into an electronic device.

8. A method comprising:
    applying a first mask to a semiconductor device to firm a patterned device, the first mask identifying at least one dummy gate;
    etching the patterned device to remove the at least one dummy gate to form an etched region within the patterned device; and
    depositing a strain material to the etched region within the patterned device,
    wherein the patterned device comprises:
        a first cell comprising a first gate between a first drain and a first source;
        a second cell adjacent to the first cell, the second cell comprising a second gate between a second drain and a second source; and
        a shallow trench isolation area between the first source and the second source,
        wherein a first gate-to-gate distance of a first set of adjacent cells of the semiconductor device having a common drain is smaller than a second gate-to-gate distance of a second set of adjacent cells of the semiconductor device having separate sources.

9. The method of claim 8, further comprising fabricating a semiconductor device that comprises the strain material.

10. The method of claim 9, wherein the at least one dummy gate is electrically isolated from functional circuitry within the semiconductor device.

11. The method of claim 8, further comprising using a second mask to etch the patterned device.

12. The method of claim 8, wherein the at least one dummy gate is non-operational.

13. The method of claim 8, wherein the strain material comprises silicon nitride.

14. The method of claim 13, wherein the strain material has strong tensile stress and is deposited over a source of an n-type field effect transistor (NFET) device that is adjacent to the etched region.

15. The method of claim 13, wherein the strain material has a compressive stress and is deposited over a source of a p-type field effect transistor (PFET) device that is adjacent to the etched region.

16. The method of claim 8, wherein the strain material comprises silicon carbide.

17. The method of claim 8, wherein depositing the strain material is initiated by a processor integrated into an electronic device.

18. A method comprising:
a first step for applying a first mask to a semiconductor device to form a patterned device, the first mask identifying at least one dummy gate;
a second step for etching the patterned device to remove the at least one dummy gate to form an etched region within the patterned device; and
a third step for depositing a strain material to the etched region within the patterned device,
wherein the patterned device comprises:
a first cell comprising a first gate between a first drain and a first source;
a second cell adjacent to the first cell, the second cell comprising a second gate between a second drain and a second source; and
a shallow trench isolation area between the first source and the second source,
wherein a first gate-to-gate distance of a first set of adjacent cells of the semiconductor device having a common drain is smaller than a second gate-to-gate distance of a second set of adjacent cells of the semiconductor device having separate sources.

19. The method of claim 18, wherein the first step, the second step, and the third step are initiated by a processor integrated into an electronic device.

20. A computer readable tangible medium storing instructions executable by a computer, the instructions comprising:
instructions that are executable by the computer to initiate applying a strain material to a semiconductor device comprising multiple cells, at least two of the cells adjacent to each other,
wherein a first of the at least two cells comprises a first source and a second of the at least two cells comprises a second source,
wherein the first source is proximate to the second source and wherein a shallow trench isolation area is between the first source and the second source,
wherein at least a portion of the strain material is deposited over the shallow trench isolation area between the first source and the second source, and
wherein a first gate-to-gate distance of a first set of adjacent cells of the semiconductor device having a common drain is smaller than a second gate-to-gate distance of a second set of adjacent cells of the semiconductor device having separate sources.

21. The computer readable tangible medium of claim 20, wherein the computer is integrated in one of a communications device and a fixed location data unit.

22. A method comprising:
receiving design information representing at least one physical property of a semiconductor device, the semiconductor device comprising:
a first cell comprising a first gate between a first drain and a first source;
a second cell adjacent to the first cell, the second cell comprising a second gate between a second drain and a second source; and
a shallow trench isolation area between the first source and the second source,
wherein a first gate-to-gate distance of a first set of adjacent cells of the semiconductor device having a common drain is smaller than a second gate-to-gate distance of a second set of adjacent cells of the semiconductor device having separate sources, and
wherein a first amount of strain material over the first source and over the second source is greater than a second amount of strain material over the first drain and over the second drain;
transforming the design information to comply with a file format; and
generating a data file including the transformed design information.

23. The method of claim 22, wherein the data file includes a GDSII format.

24. A method comprising:
receiving a data file comprising design information corresponding to a semiconductor device; and
fabricating the semiconductor device according to the design information, wherein the semiconductor device comprises:
a first cell comprising a first gate between a first drain and a first source;
a second cell adjacent to the first cell, the second cell comprising a second gate between a second drain and a second source; and
a shallow trench isolation area between the first source and the second source,
wherein a first gate-to-gate distance of a first set of adjacent cells of the semiconductor device having a common drain is smaller than a second gate-to-gate distance of a second set of adjacent cells of the semiconductor device having separate sources, and
wherein a first amount of strain material over the first source and over the second source is greater than a second amount of strain material over the first drain and over the second drain.

25. The method of claim 24, wherein the data file has a GDSII format.

26. A method comprising:
receiving design information comprising physical positioning information of a packaged semiconductor device on a circuit board, the packaged semiconductor device comprising:
a first cell comprising a first gate between a first drain and a first source;

a second cell adjacent to the first cell, the second cell comprising a second gate between a second drain and a second source; and a shallow trench isolation area between the first source and the second source, wherein a first gate-to-gate distance of a first set of adjacent cells of the semiconductor device having a common drain is smaller than a second gate-to-gate distance of a second set of adjacent cells of the semiconductor device having separate sources, and wherein a first amount of strain material over the first source and over the second source is greater than a second amount of strain material over the first drain and over the second drain; and transforming the design information to generate a data file.

27. The method of claim 26, wherein the data file has a GERBER format.

28. A method comprising:

receiving a data file comprising design information comprising physical positioning information of a packaged semiconductor device on a circuit board; and manufacturing the circuit board configured to receive the packaged semiconductor device according to the design information, wherein the packaged semiconductor device comprises:

a first cell comprising a first gate between a first drain and a first source;

a second cell adjacent to the first cell, the second cell comprising a second gate between a second drain and a second source; and a shallow trench isolation area between the first source and the second source, wherein a first gate-to-gate distance of a first set of adjacent cells of the semiconductor device having a common drain is smaller than a second gate-to-gate distance of a second set of adjacent cells of the semiconductor device having separate sources, and wherein a first amount of strain material over the first source and over the second source is greater than a second amount of strain material over the first drain and over the second drain.

29. The method of claim 28, wherein the data file has a GERBER format.

30. The method of claim 28, further comprising integrating the circuit board into a device selected from the group consisting of a set top box, a music player, a video player, an entertainment unit, a navigation device, a communications device, a personal digital assistant (PDA), a fixed location data unit, and a computer.

31. The method of claim 1, wherein the first set of adjacent cells includes the first of the at least two cells and the second set of adjacent cells includes the second of the at least two cells.

32. The method of claim 8, wherein the first set of adjacent cells includes the first cell and the second set of adjacent cells includes the second cell.

33. The method of claim 18, wherein the first set of adjacent cells includes the first cell and the second set of adjacent cells includes the second cell.

34. The computer readable tangible medium of claim 20, wherein the first set of adjacent cells includes the first of the at least two cells and the second set of adjacent cells includes the second of the at least two cells.

35. The method of claim 22, wherein the first set of adjacent cells includes the first cell and the second set of adjacent cells includes the second cell.

36. The method of claim 24, wherein the first set of adjacent cells includes the first cell and the second set of adjacent cells includes the second cell.

37. The method of claim 26, wherein the first set of adjacent cells includes the first cell and the second set of adjacent cells includes the second cell.

38. The method of claim 28, wherein the first set of adjacent cells includes the first cell and the second set of adjacent cells includes the second cell.

* * * * *